US011024728B2

(12) United States Patent
Dutta

(10) Patent No.: US 11,024,728 B2
(45) Date of Patent: Jun. 1, 2021

(54) MONOLITHIC SELF-ALIGNED HETEROJUNCTION BIPOLAR TRANSISTOR (HBT) AND COMPLEMENTARY METAL-OXIDE-SEMICONDUCTOR (CMOS)

(71) Applicant: QUALCOMM Incorporated, San Diego, CA (US)

(72) Inventor: Ranadeep Dutta, Del Mar, CA (US)

(73) Assignee: QUALCOMM Incorporated, San Diego, CA (US)

( * ) Notice: Subject to any disclaimer, the term of this patent is extended or adjusted under 35 U.S.C. 154(b) by 16 days.

(21) Appl. No.: 16/276,762

(22) Filed: Feb. 15, 2019

(65) Prior Publication Data

US 2020/0266290 A1   Aug. 20, 2020

(51) Int. Cl.
| | |
|---|---|
| *H01L 29/737* | (2006.01) |
| *H01L 29/66* | (2006.01) |
| *H01L 29/205* | (2006.01) |
| *H01L 29/06* | (2006.01) |
| *H01L 29/10* | (2006.01) |
| *H01L 29/08* | (2006.01) |
| *H01L 27/06* | (2006.01) |

(52) U.S. Cl.
CPC ...... *H01L 29/7371* (2013.01); *H01L 27/0623* (2013.01); *H01L 29/0649* (2013.01); *H01L 29/0817* (2013.01); *H01L 29/0821* (2013.01); *H01L 29/0826* (2013.01); *H01L 29/1004* (2013.01); *H01L 29/205* (2013.01); *H01L 29/66242* (2013.01); *H01L 29/66318* (2013.01)

(58) Field of Classification Search
None
See application file for complete search history.

(56) References Cited

U.S. PATENT DOCUMENTS

| | | | | |
|---|---|---|---|---|
| 4,933,732 | A  * | 6/1990 | Katoh ................. | H01L 29/7371 257/12 |
| 5,019,524 | A  * | 5/1991 | Mitani ................ | H01L 29/1004 148/DIG. 10 |
| 5,073,812 | A  * | 12/1991 | Shimura .............. | H01L 21/033 257/587 |
| 6,492,664 | B2 * | 12/2002 | Tanomura ............ | H01L 29/0821 257/183 |
| 8,450,804 | B2 * | 5/2013 | Sekar .................. | H01L 27/0688 257/347 |
| 2002/0117685 | A1 * | 8/2002 | Mochizuki .......... | H01L 29/7327 257/198 |
| 2008/0121938 | A1 * | 5/2008 | Morita .............. | H01L 29/66318 257/198 |
| 2010/0181674 | A1 * | 7/2010 | Tabatabaie .......... | H01L 27/0605 257/761 |

\* cited by examiner

*Primary Examiner* — Andres Munoz
(74) *Attorney, Agent, or Firm* — Patterson + Sheridan, LLP

(57) ABSTRACT

Certain aspects of the present disclosure generally relate to an integrated circuit (IC) having a heterojunction bipolar transistor (HBT) device. The HBT device generally includes an emitter region and a collector region. The collector region may include a proton implant region having an edge aligned with an edge of the emitter region. In certain aspects, the HBT device also includes a base region disposed between the emitter region and the collector region.

19 Claims, 13 Drawing Sheets

MONOLITHIC SELF-ALIGNED HETEROJUNCTION BIPOLAR TRANSISTOR (HBT) AND COMPLEMENTARY METAL-OXIDE-SEMICONDUCTOR (CMOS)

TECHNICAL FIELD

Certain aspects of the present disclosure generally relate to electronic components and, more particularly, to transistors.

BACKGROUND

Complementary metal-oxide semiconductor (CMOS) devices are fundamental components for integrated circuits to implement digital logic. A CMOS device typically includes a p-type metal-oxide semiconductor (PMOS) used to pull an output to logic high and an n-type metal-oxide semiconductor (NMOS) used to pull the output down to logic low, depending on an input signal provided to the gates of the PMOS and NMOS transistors. A heterojunction bipolar transistor (HBT) is a type of bipolar junction transistor (BJT) which uses differing semiconductor materials for the emitter and base regions, creating a heterojunction.

SUMMARY

Certain aspects of the present disclosure generally relate to an integrated circuit (IC) having a heterojunction bipolar transistor (HBT) device. The HBT device generally includes an emitter region and a collector region. The collector region may include a proton implant region having an edge aligned with an edge of the emitter region. In certain aspects, the HBT device also includes a base region disposed between the emitter region and the collector region.

Certain aspects of the present disclosure generally relate to an integrated circuit (IC) having a heterojunction bipolar transistor (HBT) device. The HBT device generally includes an emitter region; a spacer, wherein the emitter region is surrounded, at least in part, by the spacer; a collector region, wherein the collector region comprises a proton implant region having an edge aligned with an edge of the spacer; and a base region disposed between the emitter region and the collector region.

Certain aspects of the present disclosure generally relate to a method for fabricating an integrated circuit (IC). The method generally includes forming a collector region, forming a base region above the collector region, forming an emitter region above the base region, forming a mask region above the emitter region, etching the mask region such that only a portion of the mask region is above the emitter region, and performing proton implantation to form a proton implant region of the collector region after the etching of the mask region.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Certain aspects of the present disclosure are generally directed to a monolithic integration of a group III/V heterojunction bipolar transistor (HBT) and complementary metal-oxide-semiconductor (CMOS) on a silicon substrate. For example, certain aspects allow a full radio frequency front-end (RFFE) system on a single chip, with devices selected to improve performance, on group III/V semiconductor and silicon (Si). Certain aspects also provide techniques for reducing base-collector capacitance (Cbc) due to a smaller base-collector junction area as compared to conventional implementations. Certain aspects also provide cost benefits from co-integration of group III-V and Si-based devices and passives on a large area wafer, and cycle time benefits due to the ability to recombine CMOS and group III-V lots.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Example Semiconductor Device

A RFFE module typically includes semiconductor components (e.g., implemented by CMOS) for controls, switches, digital processing, and power amplification, which may be assembled as discrete elements on a laminate substrate. Discrete components on modules lead to high parasitic resistance, inductance, and capacitance, resulting in losses at high frequency bands. The discrete devices may be fabricated individually, in separate fabrication facilities, on different size wafers, at significant cost and cycle times. Furthermore, an HBT's base-collector capacitance and base resistance contribute to limiting power gain, particularly at high frequencies. For any given emitter mesa area (e.g., which may be set by current and output RF power specifications), the base mesa occupies a large area. A typical ratio of the base mesa to emitter junction areas on present HBT unit cells may be about 2.4. The large base-collector capacitance (Cbc) from the base mesa area compromises an amplifier's power gain and efficiency, particularly at higher frequencies.

Figure 1:
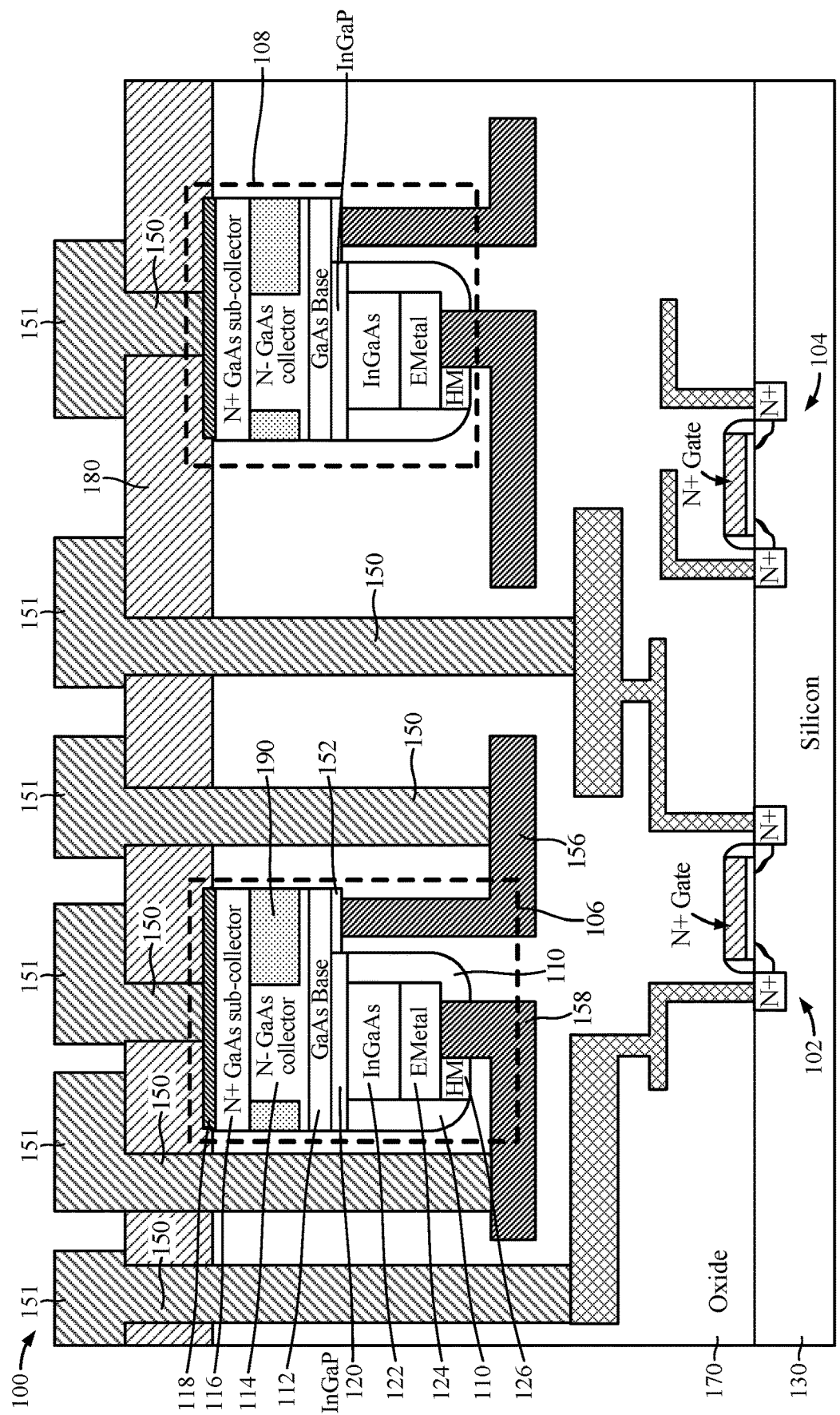
FIG. 1 is a cross-sectional view of a semiconductor device having complementary metal-oxide-semiconductor (CMOS) devices and heterojunction bipolar transistor (HBT) devices, in accordance with certain aspects of the present disclosure.

FIG. 1 is a semiconductor device 100 having CMOS devices 102, 104 and HBT devices 106, 108 (e.g., a group III-V HBT), in accordance with certain aspects of the present disclosure. The CMOS devices 102, 104 are disposed on a substrate 130 (e.g., 100 oriented substrate). The HBT devices 106, 108 are integrated using a self-aligned proton implant, to reduce Cbc as compared to conventional implementations, as described in more detail herein. For example, the HBT device 106 may include a spacer 110 which may be implemented using insulator material. The HBT device may also include a base region 112, a collector region 114, and a sub-collector region 116, which may be implemented using gallium arsenide (GaAs), as illustrated, or any other suitable III-V semiconductor. The sub-collector region 116 is coupled to one of the metal contacts (e.g., metal 2 contact) 151 and one of vias 150 through a contact 118 (e.g., comprising metal) adjacent to the dielectric region 180, as illustrated. The base region 112 is disposed adjacent to a lightly doped emitter region 120, which may be implemented using indium gallium phosphide (InGaP), and a highly doped emitter region 122, which may be implemented using indium gallium arsenide (InGaAs). In certain aspects, the highly doped region 122 may be a composite of 3 layers, an N+ doped InGaAs that contacts Emetal region 124, an N+ doped graded InGaAs that transitions toward gallium arsenide (GaAs) in composition, and an N+ doped GaAs. The spacer 110 may be implemented using dielectric material, and may surround at least a portion of the highly doped emitter region 122, as illustrated. A base metal 152 may be coupled to the base region 112 allowing for the connection of the base region 112 to one of the vias 150 through an interconnect 156 (e.g., metal 1 interconnect), as illustrated. As used herein, an edge of the proton implant may be considered as being aligned with another edge of another region (e.g., the highly doped emitter region 122) of the semiconductor device 100 if aligned within a tolerance such as +/−5 nm.

The highly doped emitter region 122 is implemented using highly doped material that allows for ohmic contact of the emitter metal (EMetal) region 124. As used herein, a highly doped region (material) generally refers to a region with a higher doping concentration than a lightly doped region (material). The EMetal region 124 is disposed above a hard mask (HM) region 126, as illustrated. An interconnect 158 may also be used to connect the EMetal to one of the vias 150, as illustrated. As illustrated, the HBT device may be surrounded in part by a dielectric region 170.

The semiconductor device 100 described herein enables monolithic integration of multiple RFFE components, individually implemented with different semiconductor materials. The semiconductor device 100 may be implemented using layer transfer to integrate the group III-V HBT for RFFE and Si CMOS for digital, control, switch, and low-noise amplifier (LNA) implementations. Monolithic integration of the RFFE components reduces module size and reduces parasitics to enable operation at high frequency bands.

FIGS. 2A-K illustrate example operations for fabricating the semiconductor device 100, in accordance with certain aspects of the present disclosure. As illustrated in FIG. 2, a group III-V epitaxy stack 204 may be grown by a metal-organic chemical vapor deposition (MOCVD) process on a substrate 202 (e.g., silicon substrate). While the examples provided herein describe an HBT device implemented using InGaP and GaAs to facilitate understanding, the aspects described herein may be used to implement other group III-V semiconductor devices, such as an indium phosphide (InP) double heterojunction bipolar transistor (DHBT)).

Figure 2A:
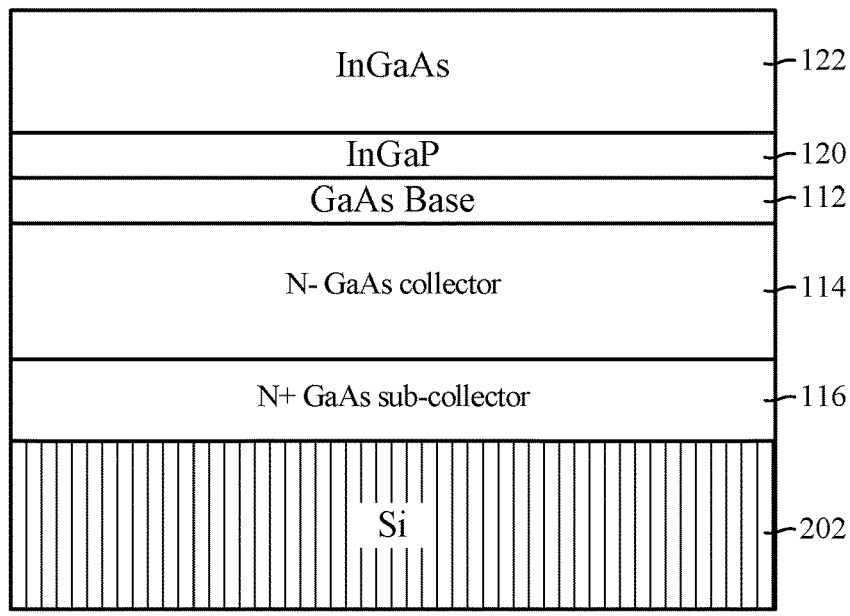
FIGS. 2A-K illustrate example operations for fabricating a semiconductor device, in accordance with certain aspects of the present disclosure.
Figure 2B:
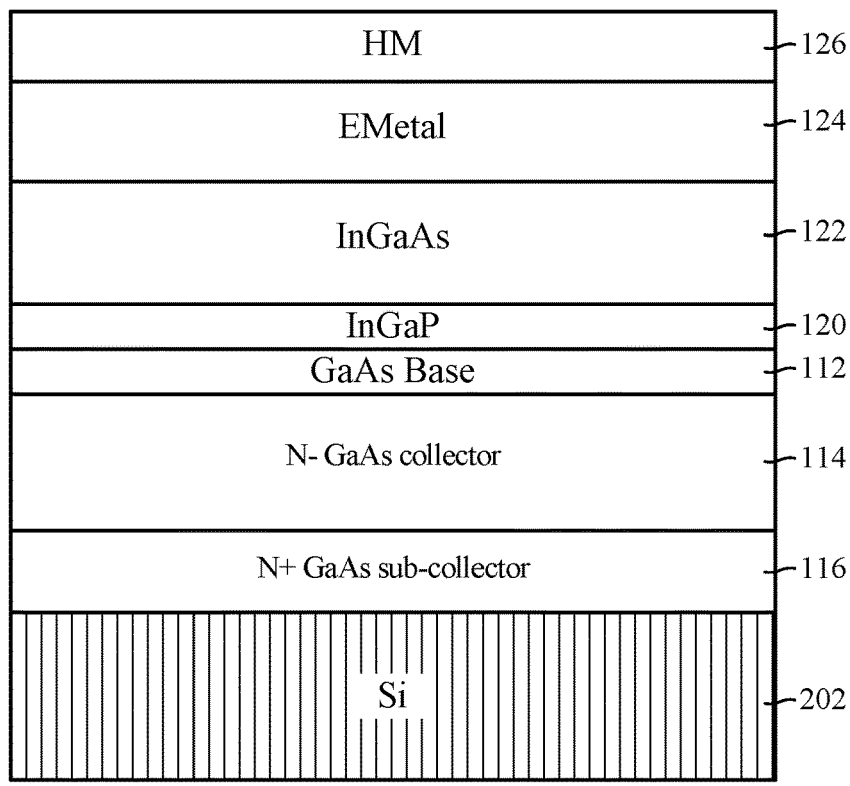
Figure 2C:
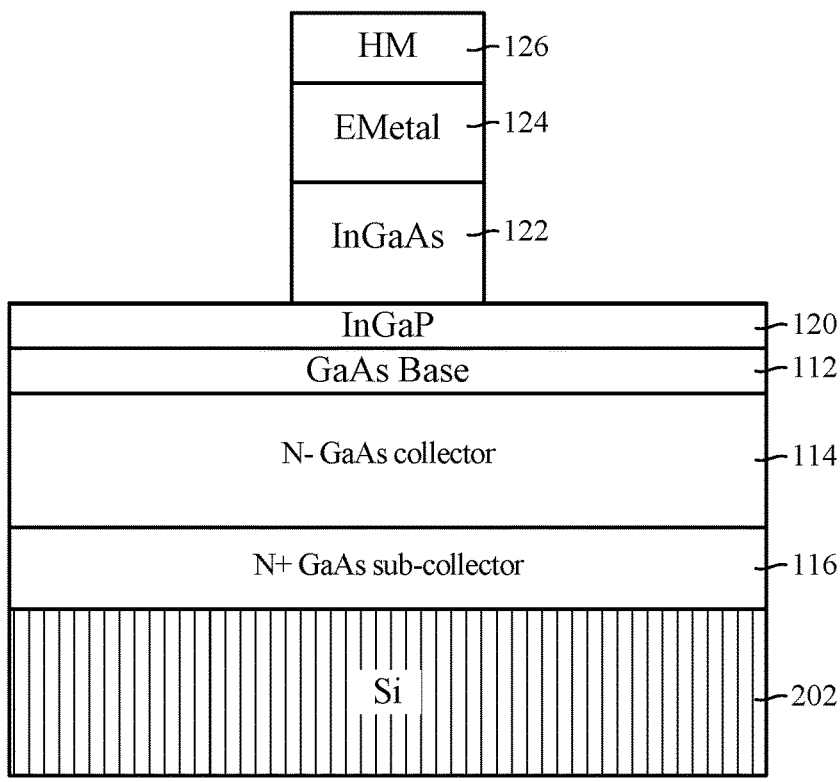
Figure 2D:
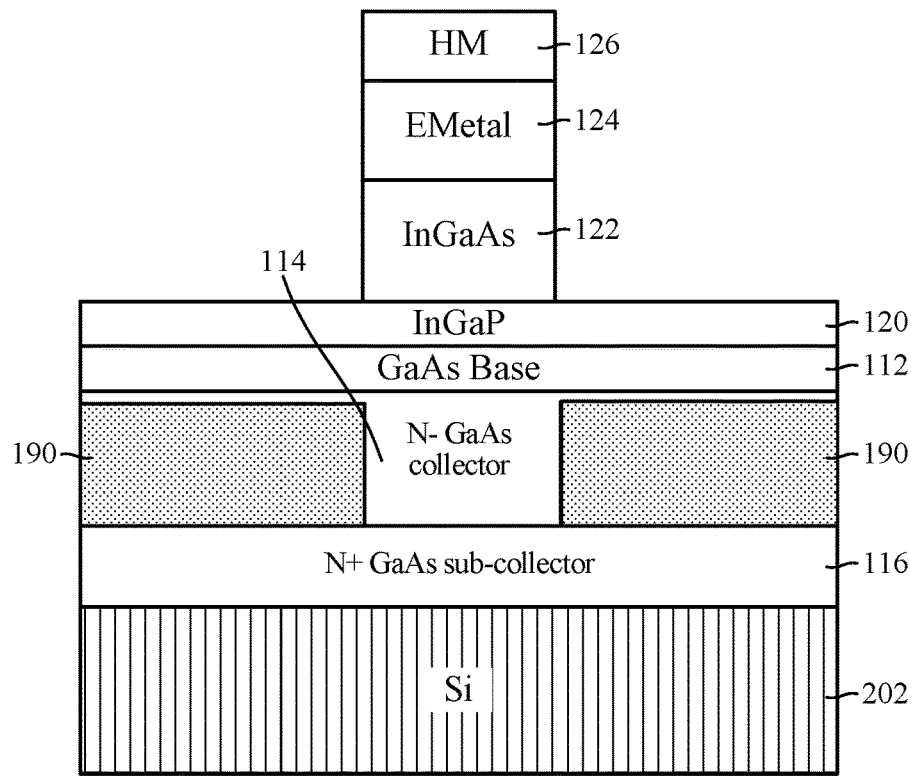

As illustrated in FIG. 2B, the EMetal region 124 and the HM region 126 are then deposited. An emitter stack mask may be implemented, followed by anistropic etching down to the lightly doped emitter region 120, as illustrated in FIG. 2C. As illustrated in FIG. 2D, a proton implant may be used to generate the proton implant regions 190. In certain aspects, the peak of the proton implant may be targeted at the collector to sub-collector boundary. Proton implantation generally refers to a process for creating an isolation region in a semiconductor that restricts current flow, thereby confining the current flow to other areas of the semiconductor. The proton implant, as illustrated in FIG. 2D, reduces the base-collector junction area, thereby reducing the Cbc of the semiconductor device 100.

Figure 2E:
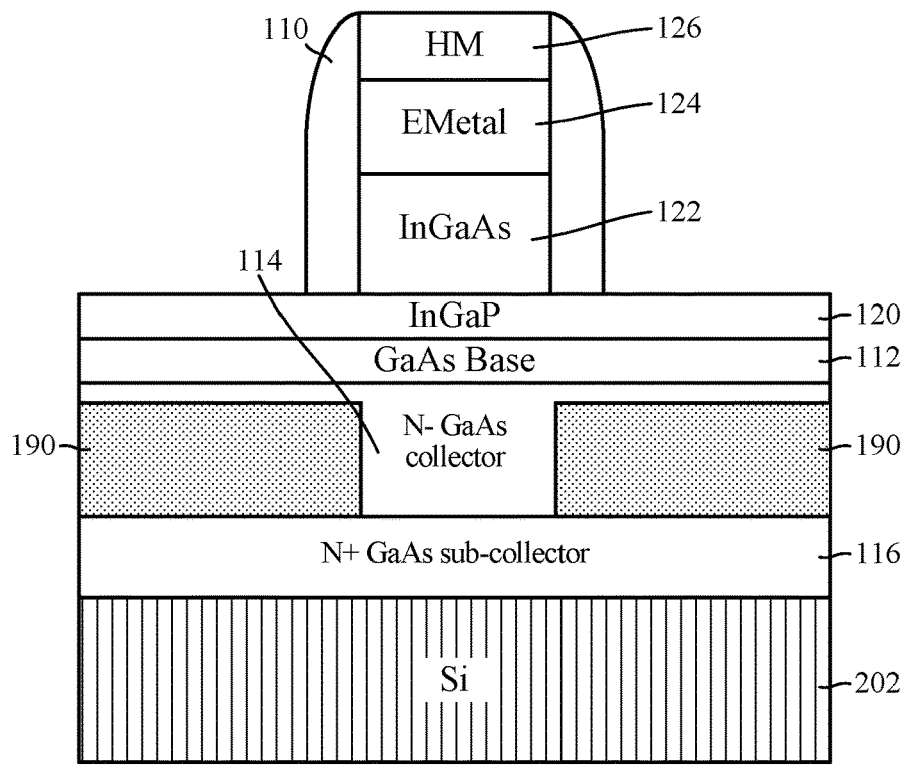
Figure 2F:
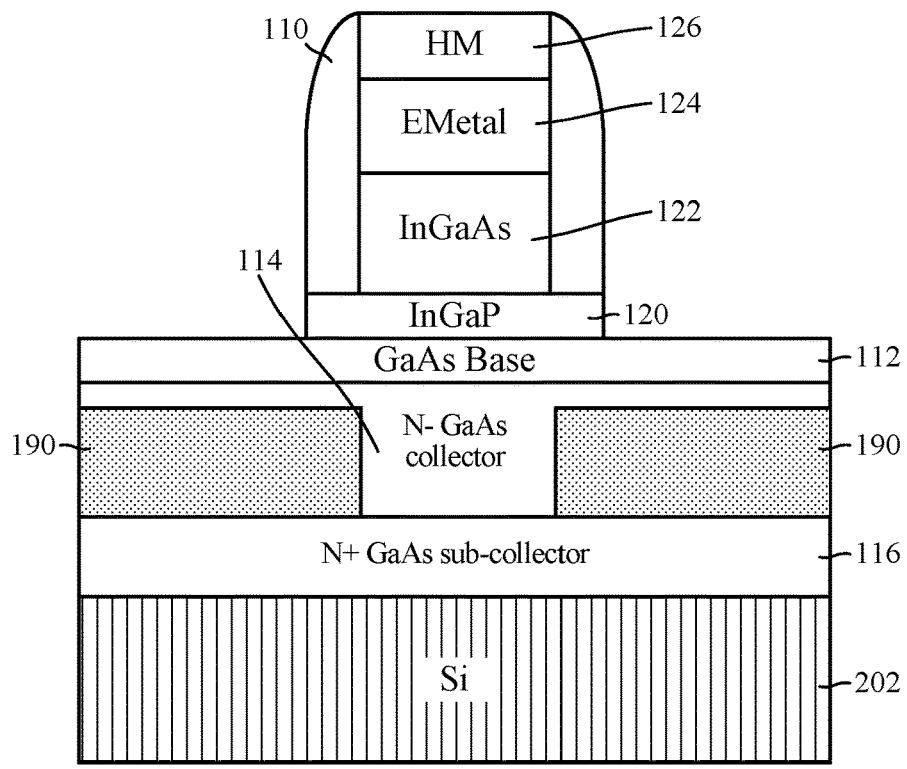
Figure 2G:
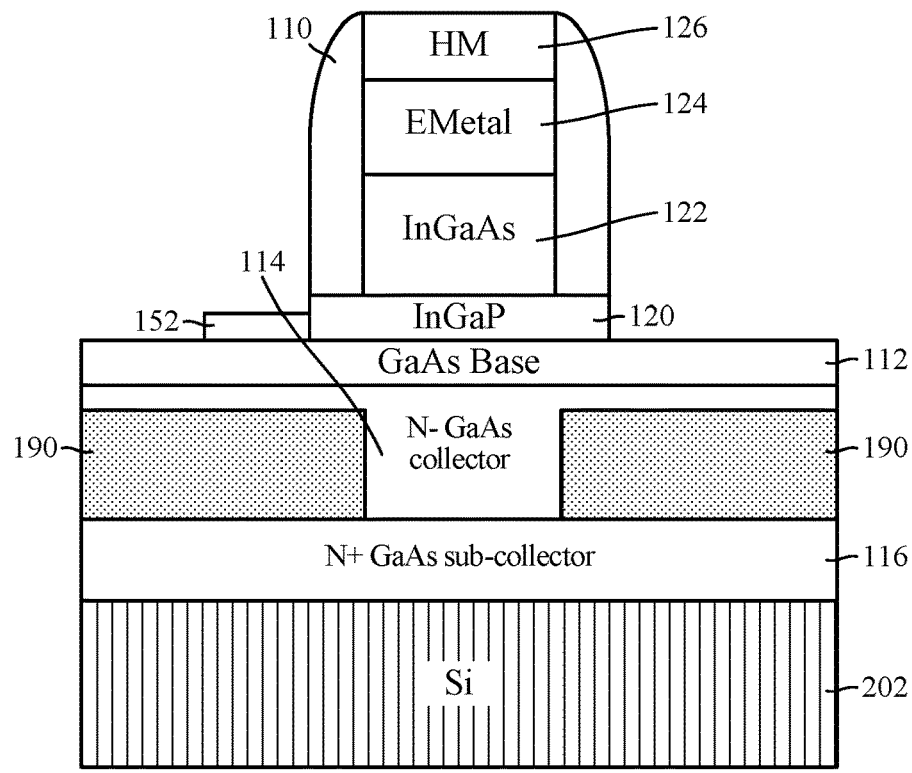
Figure 2H:
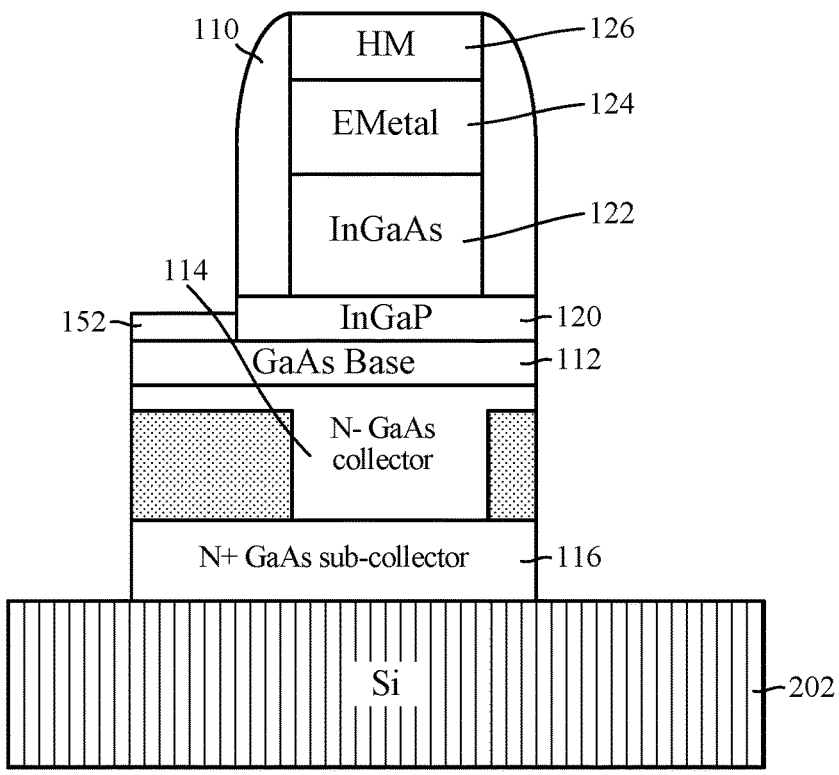
Figure 2I:
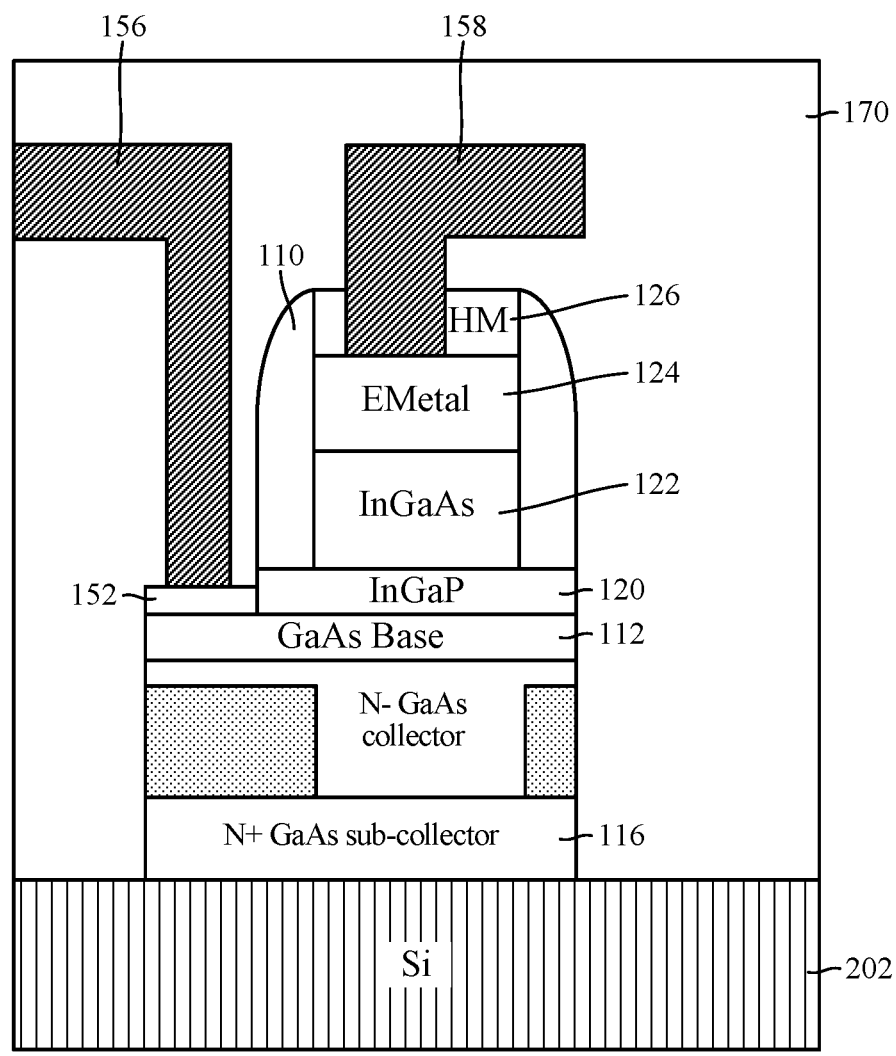

As illustrated in FIG. 2E, dielectric spacer deposition and etching may be performed to form the spacer 110. The lightly doped emitter region 120 is then etched, leaving the InGaP ledge (e.g., lightly doped emitter region 120) under the spacer 110, as illustrated in FIG. 2F. The base metal 152 may be implemented using a mask and electroplating, followed by a photoresist (PR) strip, as illustrated in FIG. 2G. As illustrated in FIG. 2H, the stack is etched down to the substrate 202 using the base metal 152 and the spacer 110 as a mask. As illustrated in FIG. 2I, passivation deposition may be used to form interconnects 156, 158 for the base and emitter of the HBT devices. Moreover, a dielectric region 170 may be disposed adjacent to the HBT device, as illustrated.

Figure 2J:
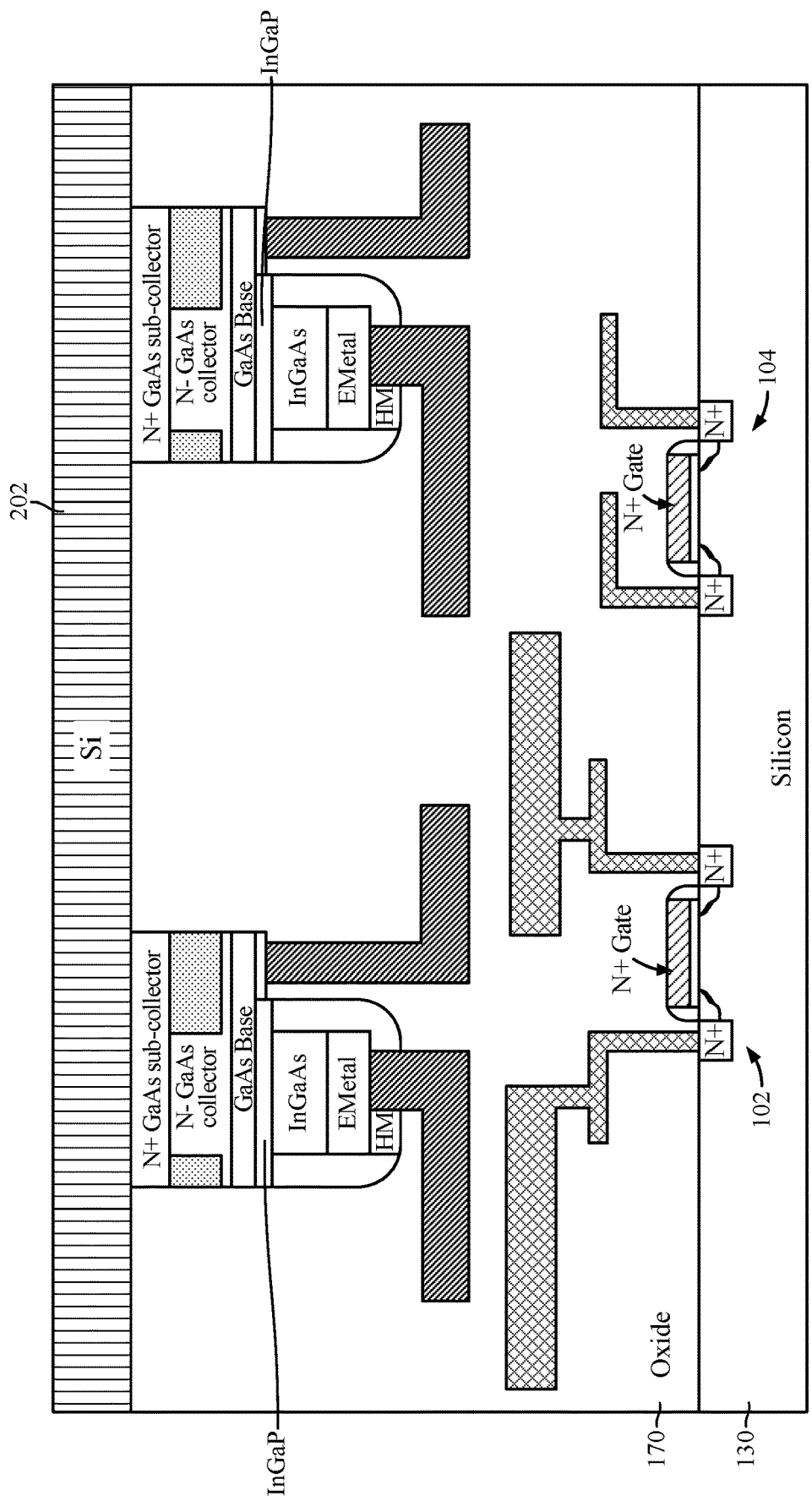
Figure 2K:
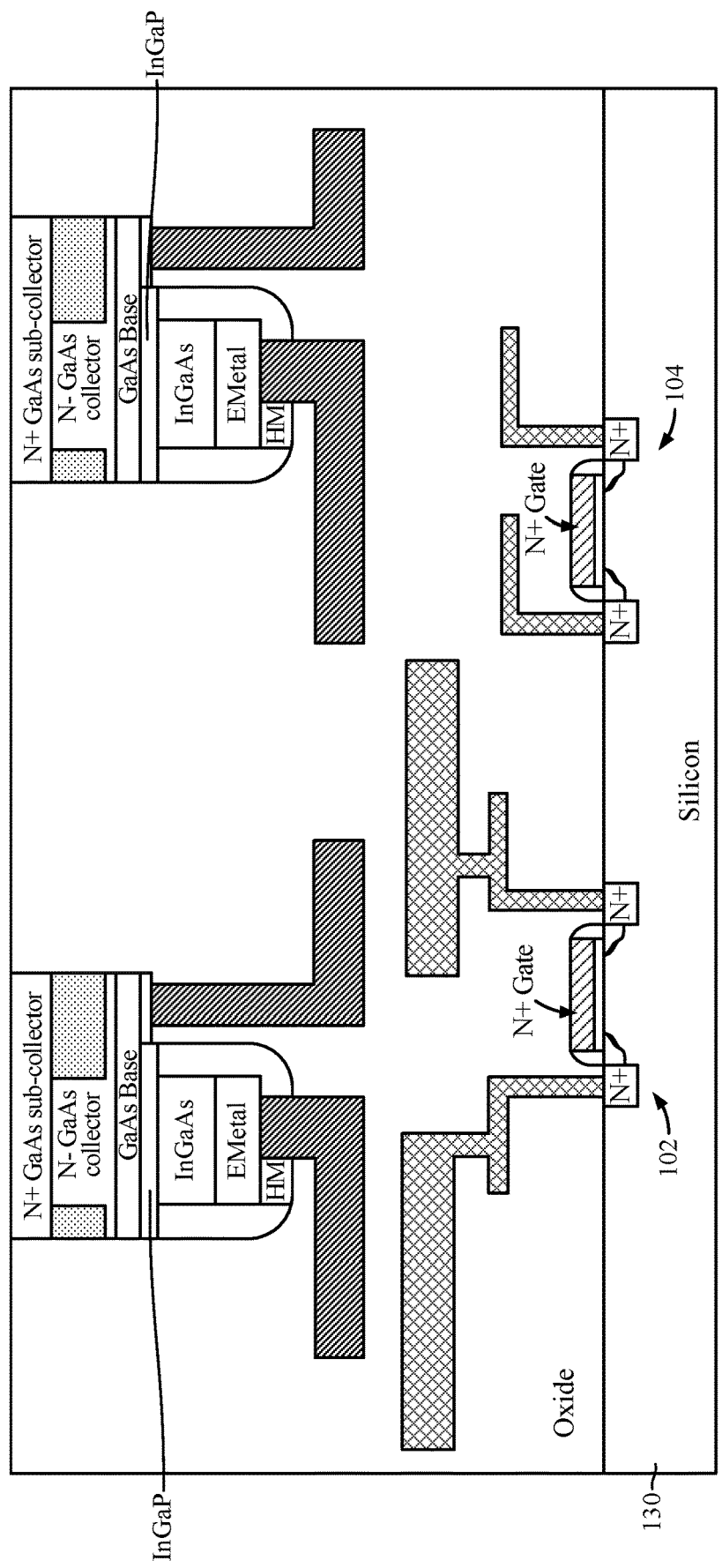

As illustrated in FIG. 2J, the HBT devices 106, 108 may then be inverted and disposed on a separate Si wafer that has completed the CMOS process flow. The inverted HBT devices 106, 108 may be bonded oxide to oxide, or otherwise held together, with the wafer having the CMOS devices in any of various suitable manners. The substrate 202 is then grinded off, as illustrated in FIG. 2K. Collector contacts are then formed, followed by dielectric deposition and patterning of the vias 150, to form the semiconductor device 100, as illustrated in FIG. 1.

Figure 3A:
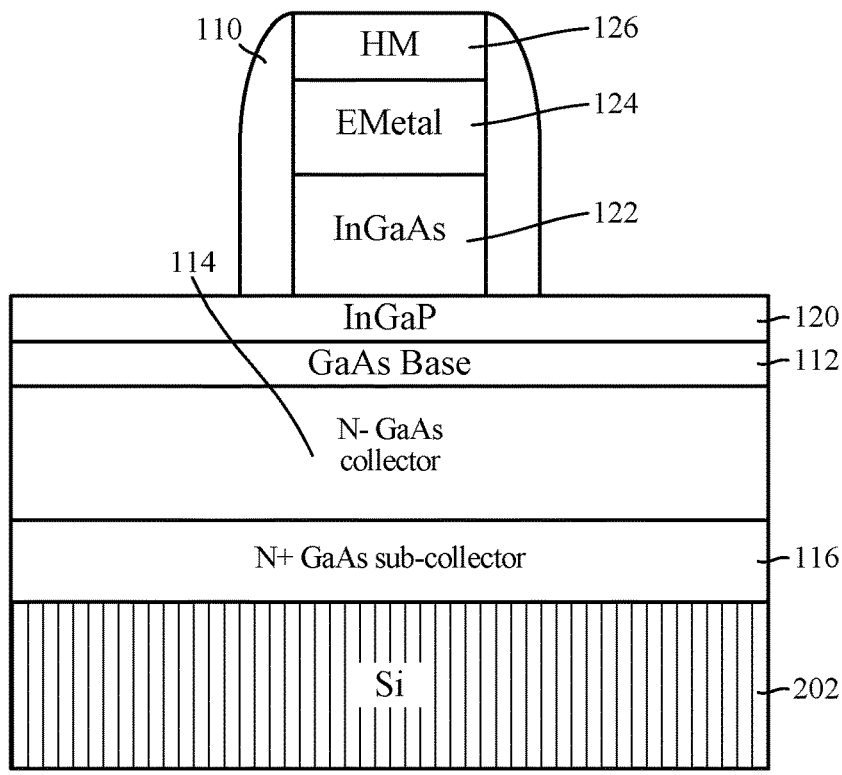
FIGS. 3A and 3B illustrate a self-aligned proton implant operation after spacer formation, in accordance with certain aspects of the present disclosure.
Figure 3B:
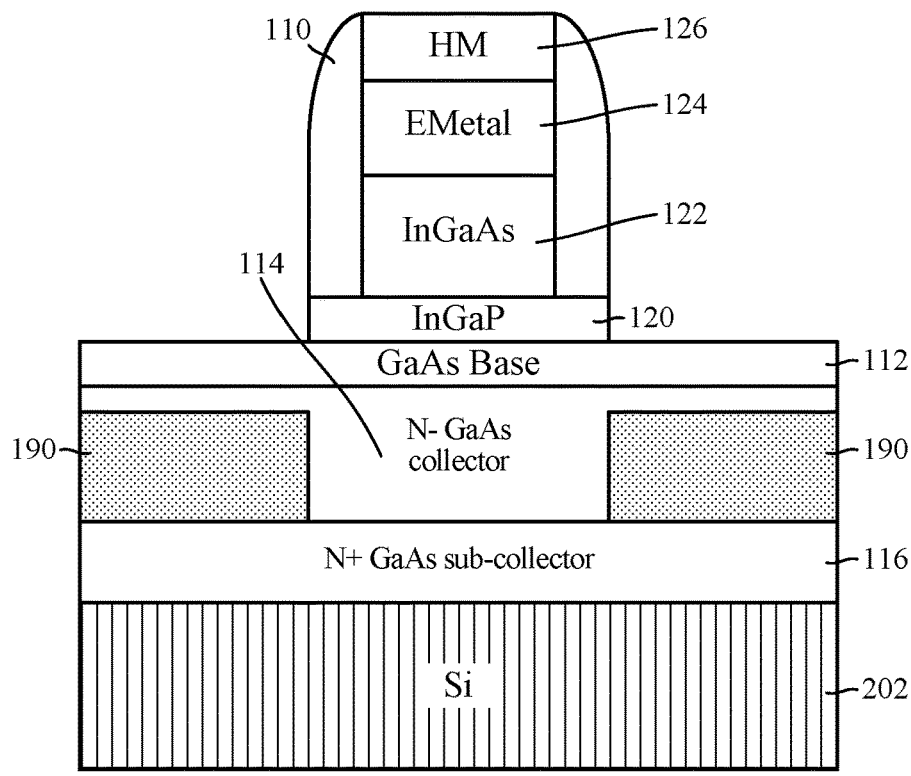

FIGS. 3A and 3B illustrate a self-aligned proton implant operation after spacer formation, in accordance with certain aspects of the present disclosure. In other words, instead of performing the proton implant after emitter stack etching, as illustrated in FIG. 2D, the proton implant of the collector region 114 may be performed after the spacer 110 is formed. For example, after the spacer 110 is formed, as illustrated in FIG. 3A, the lightly doped emitter region 120 is etched, followed by proton implantation of the collector region 114, as illustrated in FIG. 3B, to form the proton implant regions 190. Performing the proton implant operation after spacer formation, instead of after emitter stack etching, may result in a larger Cbc, but provides more process margin.

Figure 4:
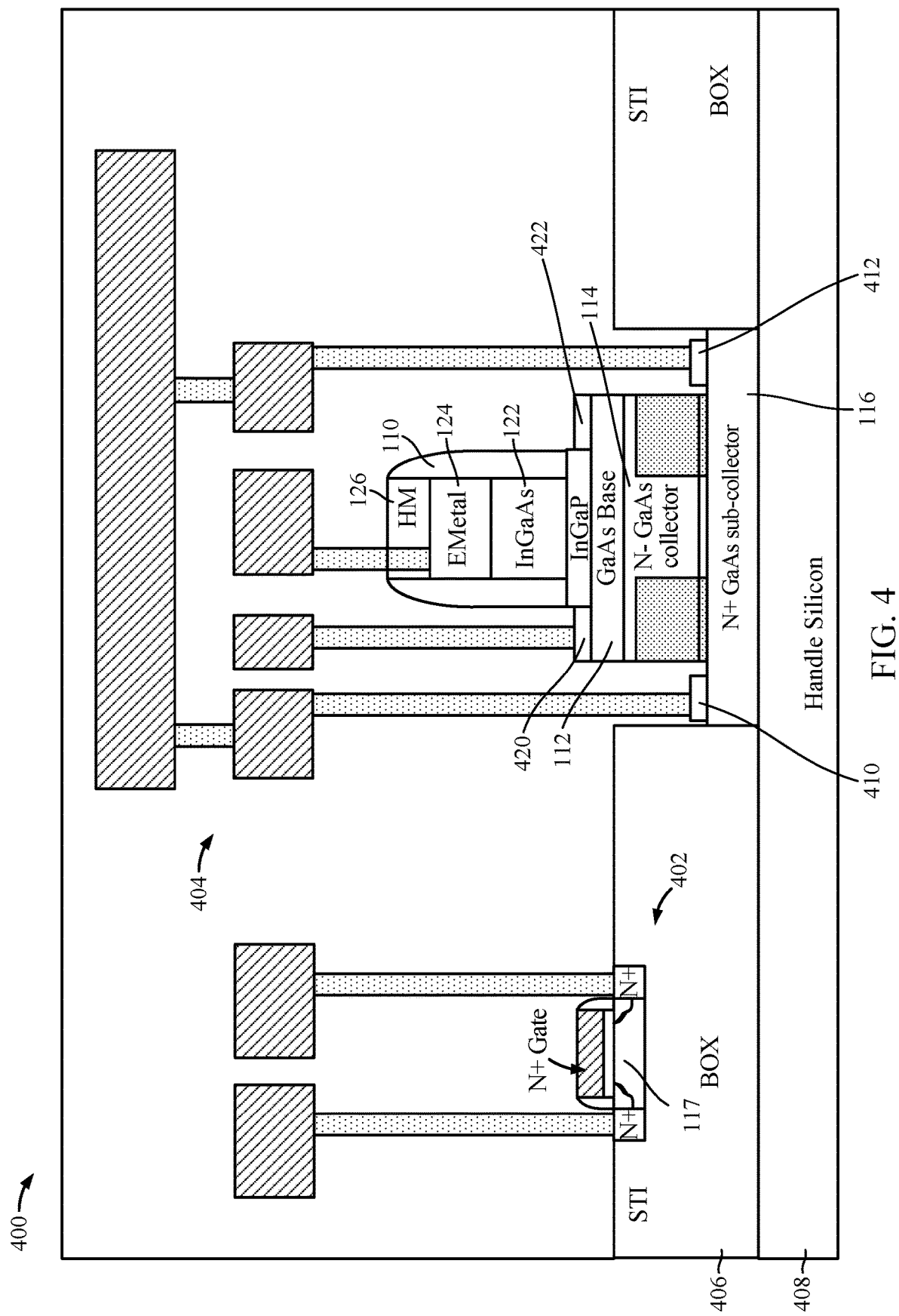
FIG. 4 is a cross-sectional view of a semiconductor device having a CMOS device and an HBT device on the same silicon-on-insulator (SOI) wafer, in accordance with certain aspects of the present disclosure.

FIG. 4 is a semiconductor device 400 having a CMOS device 402 and an HBT device 404 on the same silicon-oninsulator (SOI) wafer, in accordance with certain aspects of the present disclosure. For example, a CMOS front-end process may be performed to form the CMOS device 402 on a device (100) silicon layer 117 on top of a buried oxide (BOX) region 406, followed by HBT epitaxial stack growth by selective epitaxy on the Si handle 408 in an isolated pocket. HBT contacts are then formed (e.g., via non-gold (Au) material, for CMOS fabrication compatibility), followed by back end of line (BEOL) interconnecting of the CMOS device 402 and the HBT device 404. In this case, the sub-collector region 116 is not etched for alignment with the collector region 114, allowing for contacts 410, 412 to be formed on the sub-collector region 116. Moreover, contacts 420, 422 are formed for the base region 112 for electrical connection, as illustrated.

Figure 5:
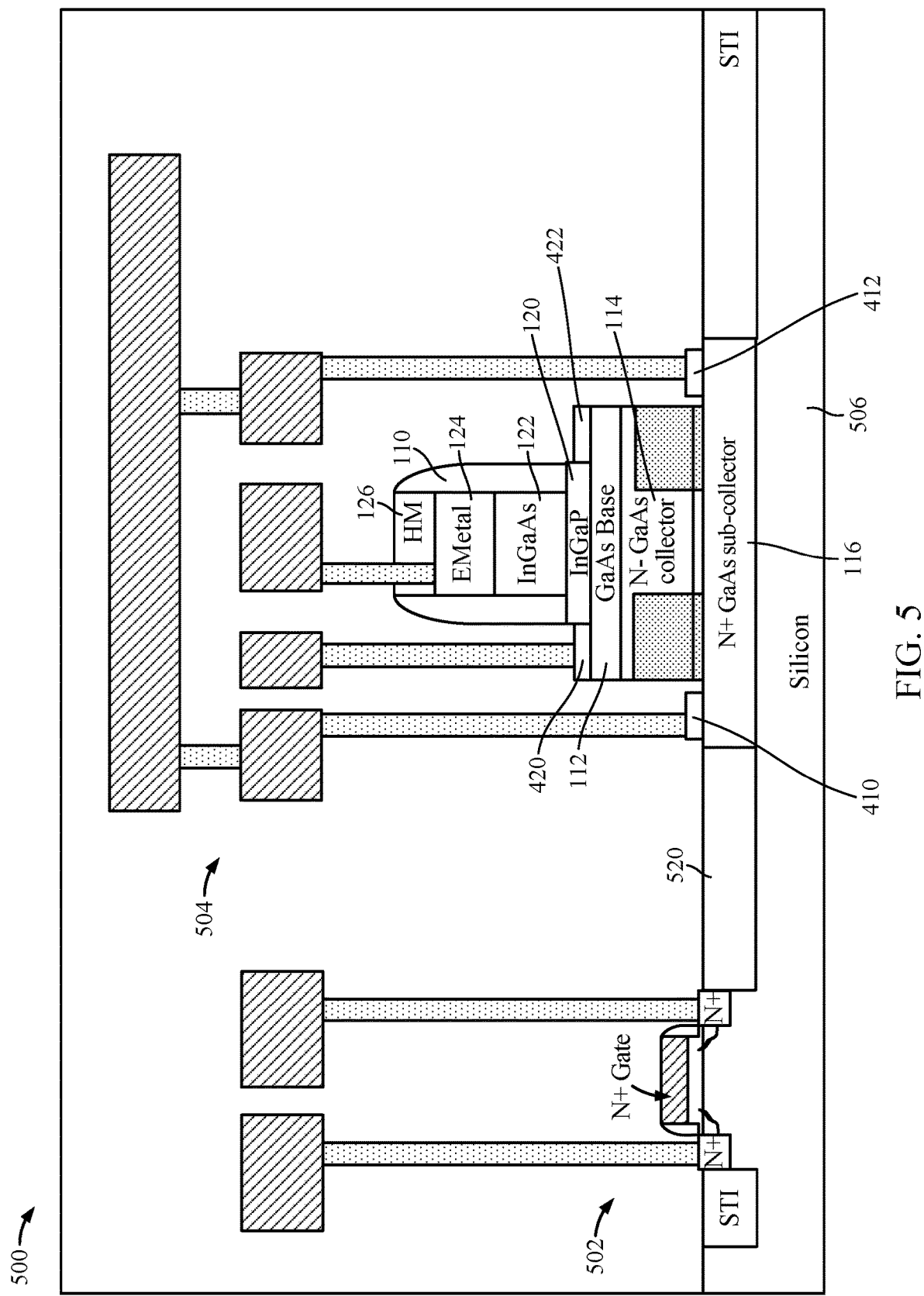
FIG. 5 is a cross-sectional view of a semiconductor device having a CMOS device and an HBT device on the same bulk silicon wafer, in accordance with certain aspects of the present disclosure.

FIG. 5 is a semiconductor device 500 having a CMOS device 502 and an HBT device 504 on the same bulk Si wafer 506, in accordance with certain aspects of the present disclosure. In this case, a CMOS front-end process is performed to form the CMOS device 502 on the bulk Si wafer 506, followed by HBT epitaxial stack growth by selective epitaxy in pockets isolated by shallow trench isolation (STI) region 520.

Figure 6:
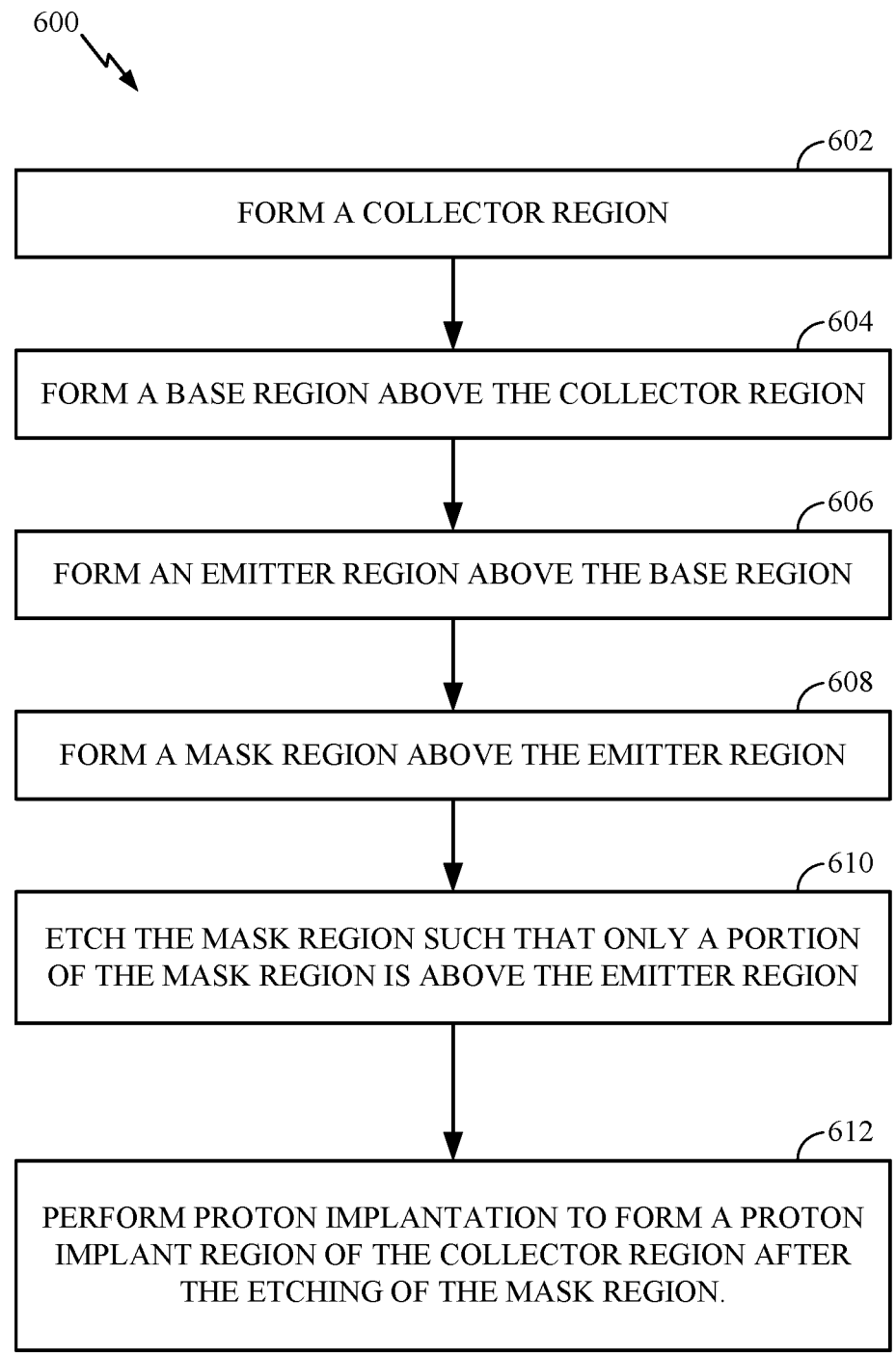
FIG. 6 is a flow diagram illustrating example operations for fabricating an integrated circuit (IC), in accordance with certain aspects of the present disclosure.

FIG. 6 is a flow diagram illustrating example operations 600 for fabricating an integrated circuit (IC), in accordance with certain aspects of the present disclosure. The operations 600 may be performed by a semiconductor processing facility for example.

The operations 600 begin, at block 602, with the semiconductor processing facility forming a collector region (e.g., collector region 114), at block 604, forming a base region (e.g., base region 112) above the collector region, and at block 606, forming an emitter region (e.g., lightly doped emitter region 120) above the base region. At block 608, the facility forms a mask region (e.g., HM region 126) above the emitter region. At block 610, facility etches the mask region such that only a portion of the mask region is above the emitter region. At block 612, the operations 600 continue with the facility performing proton implantation to form a proton implant region (e.g., proton implant region 190) of the collector region after the etching of the mask region.

In certain aspects, the operations 600 also include the facility forming a spacer (e.g., spacer 110) adjacent to the mask region, wherein the proton implantation is performed after the spacer is formed. In certain aspects, the operations also include the facility etching at least one of the emitter region, base region, or the collector region after forming the spacer.

In certain aspects, the emitter region may be a lightly doped emitter region. In this case, the operations 600 may also include the facility forming a highly doped emitter region (e.g., highly doped emitter region 122) above the lightly doped emitter region, and forming an emitter metal region (e.g., EMetal region 124) above the highly doped emitter region.

In certain aspects, the operations 600 may also include the facility forming a dielectric region (e.g., a portion of dielectric region 170) above the HBT device, forming a CMOS device, forming another dielectric region (e.g., another portion of dielectric region 170) above the CMOS device. In this case, the operations 600 also include the facility disposing the HBT device above the CMOS device such that the dielectric region formed above the HBT device is adjacent to the other dielectric region formed above CMOS device.

Figure 7:
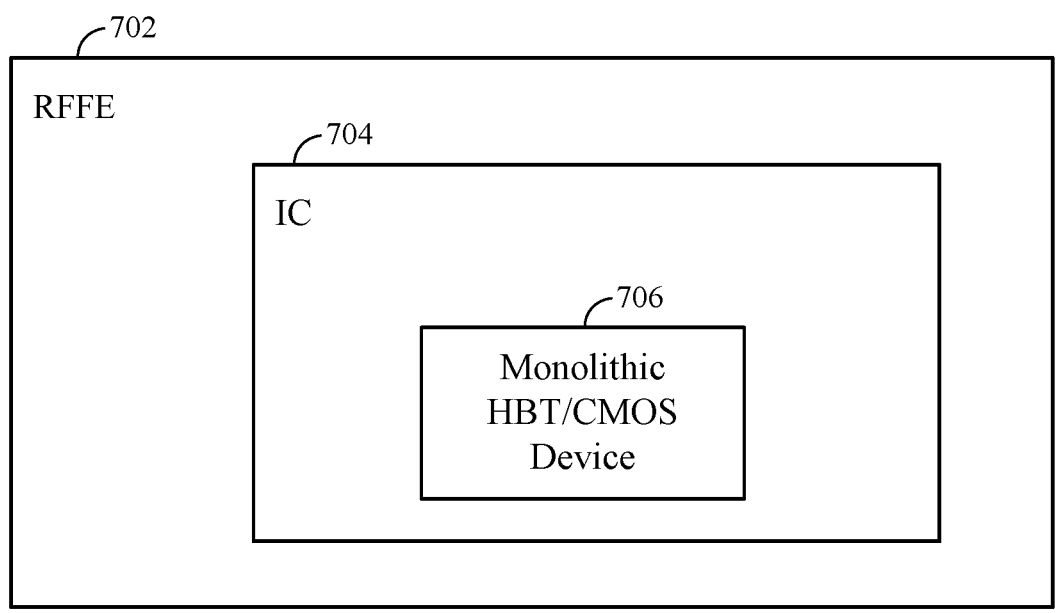
FIG. 7 is a block diagram illustrating a radio-frequency front-end (RFFE) module having an integrated circuit (IC), in accordance with certain aspects of the present disclosure.

FIG. 7 is a block diagram illustrating a radio-frequency front-end (RFFE) module 702 having an IC 704, in accordance with certain aspects of the present disclosure. For example, the IC 704 may include a monolithic CMOS/HBT device 706, as described herein. For instance, the CMOS/HBT device 706 may include the semiconductor device 100, described with respect to FIG. 1.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. An integrated circuit (IC) comprising a heterojunction bipolar transistor (HBT) device, the HBT device comprising:
   an emitter region;
   a collector region disposed above the emitter region, wherein:
      the collector region comprises:
         a proton implant region having a first lateral edge aligned with a first lateral edge of the emitter region such that the first lateral edges are arranged in a straight line; and
         another proton implant region having a second lateral edge aligned with a second lateral edge of the emitter region such that the second lateral edges are arranged in another straight line;
      the emitter region comprises:
         a lightly doped emitter region;
         an emitter metal region; and
         a highly doped emitter region disposed between the emitter metal region and the lightly doped emitter region; and
      a lateral edge of the highly doped emitter region is the first lateral edge of the emitter region that is aligned with the first lateral edge of the proton implant region such that the first lateral edges are arranged in the straight line; and
   a base region disposed between the emitter region and the collector region.

2. The IC of claim 1, further comprising a complementary metal-oxide-semiconductor (CMOS) device adjacent to the HBT device.

3. The IC of claim 2, further comprising a substrate, wherein the CMOS device is disposed between the HBT device and the substrate.

4. The IC of claim 2, further comprising a substrate, wherein the CMOS device and the HBT device are disposed above the substrate.

5. The IC of claim 2, wherein the HBT device comprises a group III-V semiconductor and wherein the CMOS device comprises a different semiconductor.

6. The IC of claim 1, further comprising:
   a sub-collector region, wherein the collector region is disposed between the sub-collector region and the base region.

7. The IC of claim 6, wherein an edge of the sub-collector region is aligned with an edge of the collector region.

8. The IC of claim 6, wherein the sub-collector region comprises a portion that extends past an edge of the collector region, the IC further comprising a contact disposed on the portion of the sub-collector region.

9. The IC of claim 1, wherein an edge of the lightly doped emitter region is aligned with an edge of the base region.

10. The IC of claim 1, further comprising a hard mask (HM) region, wherein the emitter metal region is disposed between the highly doped emitter region and the HM region.

11. An integrated circuit (IC) comprising a heterojunction bipolar transistor (HBT) device, the HBT device comprising:
    an emitter region;
    a spacer adjoining the emitter region, wherein the emitter region is surrounded, at least in part, by the spacer;
    a collector region disposed above the emitter region, wherein:
       the collector region comprises:
          a proton implant region having a first lateral edge aligned with a first lateral edge of the spacer such that the first lateral edges are arranged in a straight line; and
          another proton implant region having a second lateral edge aligned with a second lateral edge of the spacer such that the second lateral edges are arranged in another straight line;
       the emitter region comprises:
          a lightly doped emitter region;
          an emitter metal region; and
          a highly doped emitter region disposed between the emitter metal region and the lightly doped emitter region; and
       a lateral edge of the lightly doped emitter region is aligned with the first lateral edge of the proton implant region and the first lateral edge of the spacer such that the first lateral edges and the lateral edge of the lightly doped emitter region are arranged in the straight line; and
    a base region disposed between the emitter region and the collector region.

12. The IC of claim 11, further comprising a complementary metal-oxide-semiconductor (CMOS) device adjacent to the HBT device.

13. The IC of claim 11, further comprising:
    a sub-collector region, wherein the collector region is disposed between the sub-collector region and the base region.

14. The IC of claim 13, wherein an edge of the sub-collector region is aligned with an edge of the collector region.

15. An integrated circuit (IC) comprising a heterojunction bipolar transistor (HBT) device, the HBT device comprising:
    an emitter region;
    a collector region disposed above the emitter region, wherein:
       the collector region comprises:
          a proton implant region having a first lateral surface aligned with a first lateral surface of the emitter region such that the first lateral surfaces are coplanar; and
          another proton implant region having a second lateral surface aligned with a second lateral surface of the emitter region such that the second lateral surfaces are coplanar;
       the emitter region comprises:
          a lightly doped emitter region;
          an emitter metal region; and
          a highly doped emitter region disposed between the emitter metal region and the lightly doped emitter region; and a lateral surface of the highly doped emitter region is the first lateral surface of the emitter region that is coplanar with the first lateral surface of the proton implant region; and a base region disposed between the emitter region and the collector region.

16. The IC of claim 15, further comprising:

a substrate; and a complementary metal-oxide-semiconductor (CMOS) device disposed between the HBT device and the substrate.

17. The IC of claim 15, further comprising a complementary metal-oxide-semiconductor (CMOS) device adjacent to the HBT device, wherein the HBT device comprises a group III-V semiconductor and wherein the CMOS device comprises a different semiconductor.

18. The IC of claim 15, further comprising:

a sub-collector region, wherein the collector region is disposed between the sub-collector region and the base region.

19. The IC of claim 18, wherein a lateral surface of the sub-collector region is coplanar with a lateral surface of the collector region.

\* \* \* \* \*